United States Patent [19]

Araya et al.

[11] Patent Number: 5,570,424
[45] Date of Patent: Oct. 29, 1996

[54] SOUND EFFECTOR CAPABLE OF IMPARTING PLURAL SOUND EFFECTS LIKE DISTORTION AND OTHER EFFECTS

[75] Inventors: Toshinori Araya; Akio Suyama, both of Hamamatsu, Japan

[73] Assignee: Yamaha Corporation, Hamamatsu, Japan

[21] Appl. No.: 157,625

[22] Filed: Nov. 24, 1993

[30] Foreign Application Priority Data

Nov. 28, 1992 [JP] Japan .................................. 4-341382
Nov. 28, 1992 [JP] Japan .................................. 4-341383

[51] Int. Cl.$^6$ .................................................... H03G 3/00
[52] U.S. Cl. ............................................................. 381/61
[58] Field of Search ............................. 381/61, 98, 106, 381/107, 108, 120, 62

[56] References Cited

U.S. PATENT DOCUMENTS

| | | | |
|---|---|---|---|
| 4,211,138 | 7/1980 | Deutsch | 84/DIG. 9 |
| 4,868,869 | 9/1989 | Kramer | 381/61 |
| 4,995,084 | 2/1991 | Pritchard | 381/61 |

Primary Examiner—Curtis Kuntz
Assistant Examiner—Ping W. Lee
Attorney, Agent, or Firm—Loeb & Loeb LLP

[57] ABSTRACT

A distortion effector includes a calculation section for performing a predetermined higher-degree expression calculation on an input digital sound signal, and a multiplication section that is provided in series with the calculation section for multiplying the digital sound signal by a coefficient that is adjusted so as to utilize a specific portion of the higher-degree expression which exhibits a smooth distortion characteristic. The digital sound signal is distorted in accordance with a smooth non-linear curve based on the higher-degree expression calculation, to thereby achieve a mild distortion effect. In a multi-effector capable of imparting three or more predetermined effects in such a manner that the effects can be selected to be imparted independently of each other, a registration device is provided for registering, for each of the effects, whether the effect should be made switchable or not. When a collective-switching switch is operated, control is performed such that the effect-on or effect-off state is inversively switched for any effect registered as switchable. For any effect registered as non-switchable by the registration device, the effect-on or effect-off state is not switched even when the collective-switching switch is operated.

3 Claims, 5 Drawing Sheets

CUBIC EXPRESSION CALCULATING SECTION 1 3, 1 6, 1 9

F I G. 3

CUBIC EXPRESSION

SOUND EFFECTOR CAPABLE OF IMPARTING PLURAL SOUND EFFECTS LIKE DISTORTION AND OTHER EFFECTS

BACKGROUND OF THE INVENTION

The present invention relates to a sound effector for use with electronic or electric musical instruments such as music synthesizers, electric guitars or the like, and more particularly to a technique of imparting a distortion effect to a sound by digital signal processing. The present invention further relates to a multi-effector that is capable of selectively imparting plural effects by itself, and more particularly to an improvement in on/off switching control over plural effects using an effect bypass function.

In some music areas such as rock, it has been conventionally known to distort the output signals of an electric guitar through specific distortion circuitry, so as to create peculiar guitar sounds. Traditionally, such a distortion effect was achieved using nonlinear amplification characteristics of vacuum tube amplifiers, and then in later years, the age was experienced when the distortion effect was achieved using transistor circuitry. In recent years, however, it has become more and more popular to impart a distortion effect to a sound on the basis of digital signal processing.

Figure 8:
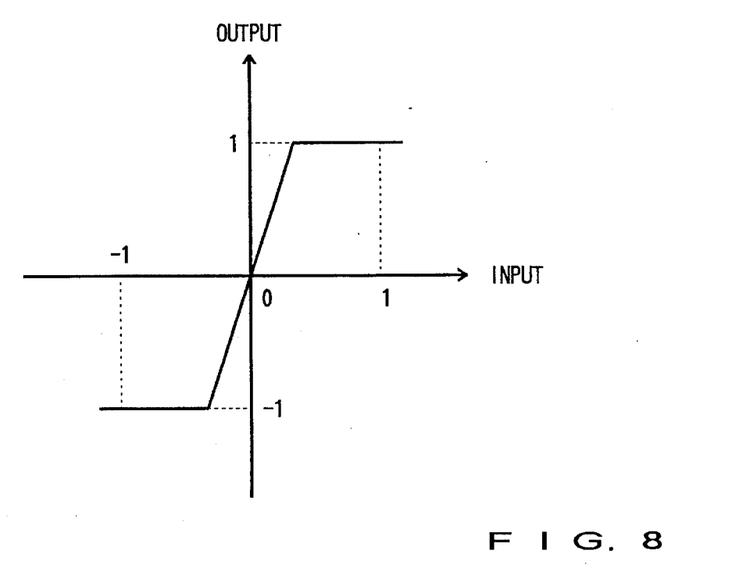
FIG. 8 is diagram illustrating an example of characteristics of conventional digital distortion effector.

According to the known distortion effect imparting technique based on digital signal processing, the output signals of an electric guitar are converted into digital data, and then the digital data are amplified by a predetermined amplification factor. Then, all of the digital data in excess of a predetermined maximum bit number (for example, 16 bits) as the result of the amplification are subjected to a so-called clipping process, by which they are treated as data of a maximum value. In FIG. 8, there are shown an example of nonlinear characteristics achieved by such a clipping process.

In the case where the effect impartment is done by digital signal processing, necessary calculations can be performed very accurately, with almost no characteristic errors caused by various components employed. Thus, the prior distortion effect device, as will be readily seen from FIG. 8, amplifies the digital data in a complete linear manner over a certain central region and then clips the data abruptly. Such characteristics tend to result in stiff, hard tone colors, which never provide mild, rich sounds that used to be provided by the natural component characteristics of the traditional vacuum tubes in an amplifier device. As the result, the distortion effect based on the digital processing has been never been satisfactory.

In addition, a multi-effector device has also been developed which is capable of achieving plural effects by itself. Among such plural effect functions assigned to the multi-effector device, compressor, distortion, chorus, flanger and reverberation may perhaps be the most popular. In general, an on/off switch for each of these effect functions is provided on the body or foot controller of the effect or device so that on/off control over each effect function can be performed independently of the other functions. Such a multi-effector device is also known which has an effect bypass function such that all assigned effect functions can be cancel led by operating the effect bypass switch, so as to allow input signals to be output with no particular effect imparted thereto.

However, with the effect bypass function of the prior multi-effector device, it is only possible to make a choice as to whether all the effect functions should be cancelled, i.e., bypassed, or all the effect functions (except such function having been turned off, namely, made ineffective by the on/off switch) should be turned on, namely, made effective. Thus, if it is desired to turn on only plural specific effect functions (for instance, compressor and distortion) selected from among a greater number of available functions (so to speak, not-all plural effect functions), it is necessary for the user to operate the respective on/off switches of the selected effect functions; in other words, the on/off switch operation must be made at least two times. Because, in ordinary cases, effect function switching operation has to be done during a performance very quickly (for instance, within one breath period), such plural operations of the on/off switches can undesirably disturb the performance.

SUMMARY OF THE INVENTION

Therefore, it is an object of the present invention to provide a digital sound effector which is, even by digital signal processing, capable of achieving a mild, soft distortion effect similar to that achieved by vacuum amplifiers.

It is another object of the present invention to provide a multi-effector which is capable of performing on/off control over only plural desired effects from among a greater number of available effect functions (not-all plural effect functions), only with a single switch operation.

To accomplish the above-mentioned object, a digital sound effector according to the present invention comprises an analog-to-digital conversion section for converting an input analog sound signal into a digital signal, a distortion effector section for imparting a distortion effect to the digital signal input from the analog-to-digital conversion section, the distortion effector section including a calculation section for performing a predetermined higher-degree expression calculation on the input digital signal, and a multiplication section provided in series with the calculation section for multiplying the digital signal by a coefficient that is adjusted so as to utilize a specific portion of the higher-degree expression which exhibits a smooth distortion characteristic, and a digital-to-analog conversion section for converting the digital signal output from the distortion effect or section into an analog signal.

In the distortion effector section, the calculation section performs a predetermined higher-degree expression calculation on the input digital signal. The multiplication section multiplies the digital signal by a coefficient that is adjusted so as to utilize a specific portion of the higher-degree expression which exhibits a smooth distortion characteristic. This combination allows the digital signal to be distorted in accordance with a smooth non-linear curve based on the higher-degree expression calculation, and thus a distortion sound of mild, rich tone color can be obtained even by digital processing.

To accomplish the above-mentioned another object, a sound effector comprises an effect imparting section for imparting three or more predetermined effects to an input sound signal in such a manner that the effects can be selected to be imparted independently of each other, an operating member for instructing a switching operation, a registration section for registering, for each of the effects, whether the effect should be made switchable or nonswitchable and a switching control section for, when a switching operation is instructed by the operating member, referring to registration by the registration section, to thereby inversively switch an effect-on or effect-off state in the effect imparting section which corresponds to any effect registered as switchable by the registration section.

The switching operation instruction by the operating member is not effective to all the effects but only to an effect or effects registered as switchable by the registration section. Thus, when the switching operation is instructed by the operating member, the effect-on or effect-off state is inversively switched only for any effect registered as switchable by the registration section. For an effect or effects registered as nonswitchable by the registration section, however, the effect-on or effect-off state is not changed even when the switching operation is instructed by the operating member. Thus, only for the effect(s) registered as switchable by the registration section, the effect-on or effect-off state is inversively switched with a single touch of the operating member. For instance, the case where only two or more effects from among a greater number of available effects are registered as switchable by the registration section, the effect-on or effect-off state is inversively switched only for these two or more effects, with a single touch of the operating member. With such arrangements, it is possible to provide a satisfactory solution to the above-described problem which has never been achieved by the prior art, i.e., it is possible to achieve inversive switching of the effect-on or effect-off (cancellation) state only for "not-all plural effects" with a single touch of a bypass switch.

Now, the preferred embodiment of the invention will be described in detail with reference to the accompanying drawings.

DETAILED DESCRIPTION OF THE PREFERRED EMBODIMENT

Figure 1:
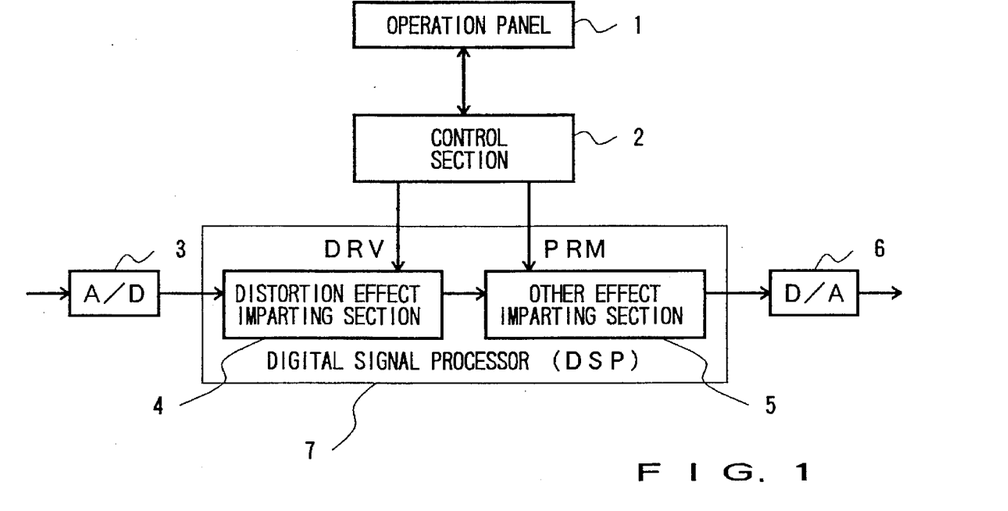
FIG. 1 is a block diagram illustrating an embodiment of a digital sound effector according to the present invention.

FIG. 1 is a block diagram illustrating the outline of a distortion effect device according to an embodiment of the invention, which is constructed as a multi-effector capable of achieving various other effects than distortion effect, such as chorus, flanger and reverberation effects.

In FIG. 1, an operation panel 1 is provided with switches and operating members, and a display in the form of, for example, an array of LEDs (light emitting diodes) or an LCD (liquid crystal display). A control section 2 performs various functions such as detecting when any of the switches and operating members has been operated or actuated, sending various parameters to a digital signal processor (hereinafter referred to as a DSP) and controlling contents to be displayed on the display. Although not specifically shown in the figure, the control section 2 includes a random access memory (hereinafter referred to as a RAM) provided with a backup power supply, to store various kinds of set data as plural kinds of programmed tone color data set (tone color setting programs). Thus, by operating a predetermined switch, it is possible to read out desired set data for reproduction at a touch.

An A/D (analog-to-digital) converter 3 converts an analog tone signal input from a guitar or the like, into digital amplitude value data of 16 bits. The digital data thus output from the A/D converter 3 is given to the DSP 7. The DSP 7 includes a distortion effect imparting section 4 that is microprogrammed for achieving a distortion effect, and an other effect imparting section 5 that is microprogrammed for achieving other effects such as chorus, flanger and reverberation. The digital tone signal to which various effects have been imparted by the DSP 7 according to the microprogramming systems is converted by a D/A (digital-to-analog) converter into an analog signal having one or more effects imparted thereto. The thus-obtained analog tone signal is provided to an unillustrated sound system composed of amplifier and loud speaker, by which the signal is audibly reproduced. In this way, a sound of a guitar or the like having been imparted distortion and/or other effects can be audibly provided by this multi-effector.

The user can adjust the degree or depth of distortion and other effects, by operating predetermined switches and operating members on the panel 1. For example, when a predetermined operating member on the panel 1 is operated by the user for adjusting the degree of distortion, parameter DRV for controlling the distortion degree is supplied to the distortion effect imparting section 4 of the DSP 7 and then used in processes which will be described in detail later. Likewise, when other operating members on the panel 1 are operated for adjusting the degree of various other effects, parameters PRM corresponding thereto are supplied to the other effect imparting section 5 of the DSP 7 and then used in processes for the other effects. The processing for the other effects may be the same as the conventionally known processing and therefore will not be described in detail here.

Figure 2:
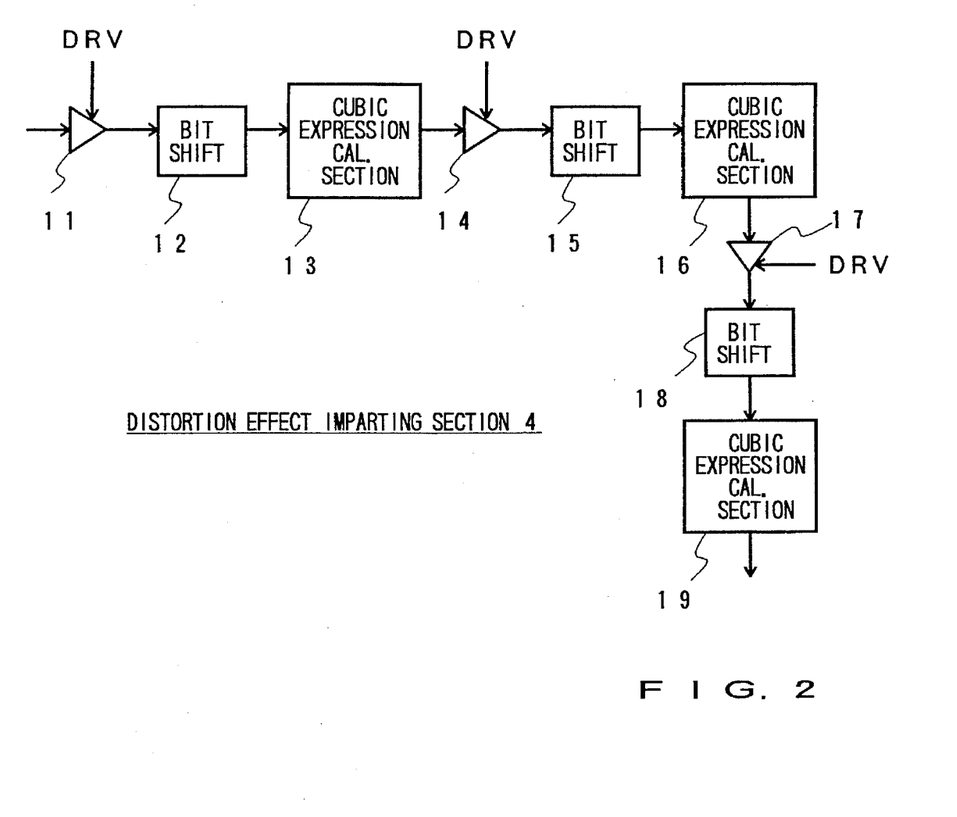
FIG. 2 is a block diagram illustrating an embodiment of a distortion effect imparting section shown in FIG. 1.

FIG. 2 illustrates, in a function block diagram, microprogramming-based processes that are performed in the distortion effect imparting section 4 of the DSP 7. To explain numerical values (each of 16 bits) used in the DSP 7, 16-bit numerical values are used in calculation as representing decimal values which express, with a 16-bit resolution, values ranging from "−1" to "1".

The tone signal converted into digital data by the A/D converter 3 is first given to a multiplier 11 in which the signal is multiplied by the parameter DRV provided from the control section 2. Because this parameter DRV is also handled as a decimal value of "−1" to "1", the multiplication will serve to adjust the magnitude of the signal into a smaller one. Next, the digital tone signal is sent to a bit shift circuit 12. The bit shift circuit 12 shifts the 16-bit data by three bits in such a direction that the absolute value of the data becomes greater. The three-bit shifting is equivalent to increasing the signal magnitude by eight times.

Combination of the above-mentioned multiplier 11 and bit shift circuit 12 provides an amplification adjusting function. Namely, if the parameter DRV is "1", the amplification will be eightfold, and if the parameter DRV is "0.5", the amplification will be fourfold. Thus, depending on the value of DRV, the amplification can be adjusted within a range from zero to eightfold. Because of this amplification adjustment, absolute values in excess of "1" are all treated as maximum value "1" as done in the prior art.

Figure 3:
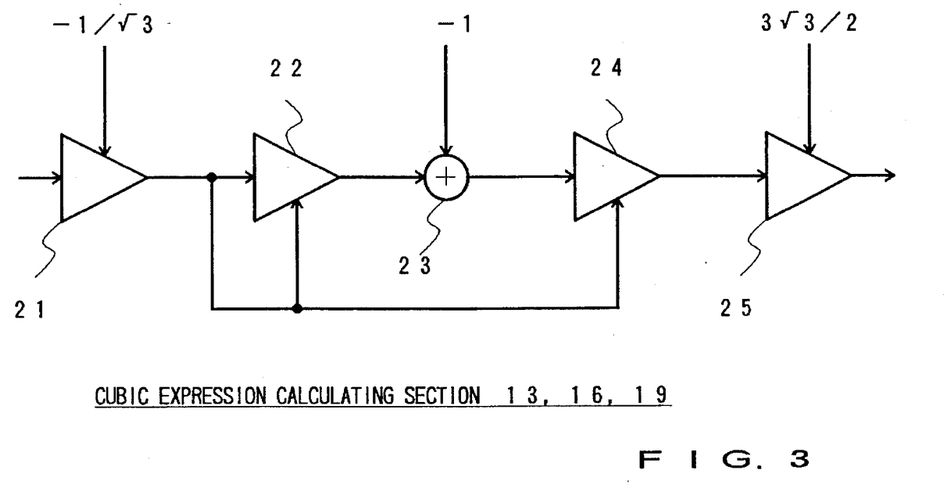
FIG. 3 is a block diagram illustrating an embodiment of a cubic expression calculating section shown in FIG. 2.

Then, the tone signal is given to a cubic expression calculating section 13 which is shown in detail in FIG. 3. As described in detail later, the calculating section 13 performs a cubic expression calculation $$Y=aX(1-bX*X) \qquad \text{Expression(1)}$$

The distortion effect imparting section 4 is composed of three serially-connected units each of which includes the multiplier 11, 14 or 17, bit shift circuit 12, 15 or 18 and cubic expression calculating section 13, 16 or 19. More specifically, the distortion effect imparting section 4 includes, in an alternating fashion, a processing section for performing the amplification adjusting function (multipliers 11, 14, 17 and bit shift circuits 12, 15, 18) and another processing section (cubic expression sections 13, 16, 19) capable of achieving nonlinear characteristics which are smoother and more complex. It should be noted that more than three such units may be connected, and the amplification adjusting and cubic expression calculating sections need not necessarily be arranged in an exact alternating fashion. Further, the expression may be other than a cubic expression such as a quintic (fifth degree) expression. Furthermore, a part of an even function such as a quartic (fourth degree) function, although it does not provide a positive-negative symmetry, may be used to achieve a unique taste. In such a case, a bypass filter may be employed if necessary, since the calculation may result in a conversion that partly contains direct current components.

Although the terms "multiplier" and "bit-shift circuit" are used here, these components, in effect, correspond to a "multiplication command step" and a "bit shift command step" in the microprogram processing within the DSP 7. But, as a matter of convenience, hardware terms such as "multiplier", "bit-shift circuit" and "adder" will be used hereinafter because they may be much easier to understand.

Next, the structure of the cubic expression calculating section 13, 16 or 19 will be described in greater detail with reference to FIG. 3. A multiplier 21 multiplies a constant $(-1\sqrt{3})$ by the tone signal given from the bit shift circuit 12, 15 or 18. As may be clear from the figure, a multiplier 22 is constructed as a squaring circuit for multiplying the tone signal by itself. An adder 23 adds the squared signal from the square circuit 22 with a constant "31 1". A multiplier 24 multiplies the unsquared signal, by the signal added by the adder 23 with constant "−1". A multiplier 25 multiplies the output from the multiplier 24 by a constant $(3\sqrt{3}/2)$. In order to multiply values greater than "1", the multiplier 25 is programmed in combination with a bit shift command as shown in FIG. 2, but only the multiplier is shown in FIG. 3 for simplicity.

From the above description, it will be seen that the circuitry of FIG. 3 represents a cubic expression of $$Y=(3/2)X(1-(1/3)X*X) \qquad \text{Expression(2)}$$

Figure 4:
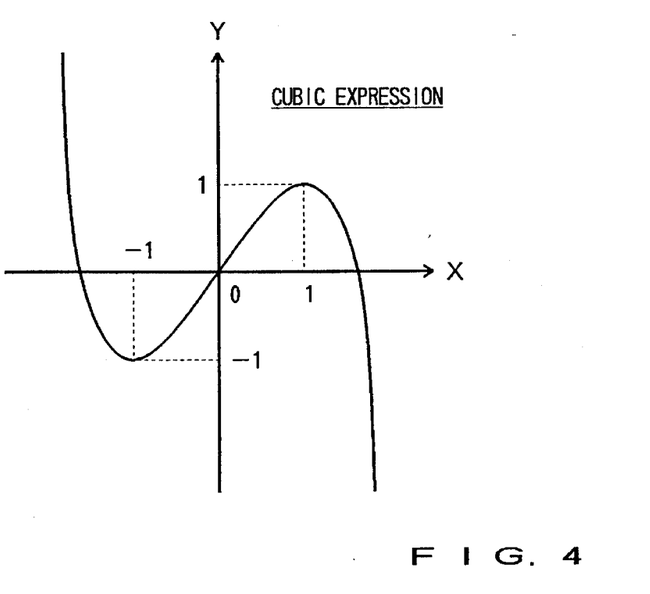
FIG. 4 is a diagram illustrating an example of functional characteristics of a cubic expression used in the embodiment.

FIG. 4 shows a graph plotted with the X-axis being the horizontal axis and the Y-axis being the vertical axis. This Expression (2) corresponds to an expression where constants "a" and "b" of Expression (1) are selected in such a manner that they take maximum values when $(X, Y)=(1, 1)$ and minimum values when $(X, Y)=(-1, -1)$. As will be understood from FIG. 4, the use of a curve of cubic expression can prevent the tone signals from being abruptly clipped as the amplification progresses and allows the signals to smoothly approach the maximum values of "1" and "31 1". However, the curve (nonlinear characteristics) in the cubic expression graph for (31 1≦X≦1) is still close to a simple straight line, and therefore three sets of the expression are connected in series so as to be used as a 27th degree expression, so that they can create a curve which achieves smooth and effective distortion characteristics. Although the constants are expressed here in irrational numbers like $(-1/\sqrt{3})$ and $(3\sqrt{3}/2)$, they are, in effect, digital data and thus it is possible to obtain the closest value with a 16-bit resolution.

Although cubic expressions are used in the above-described embodiment, another function such as a fourth-degree expression, fifth-degree expression may be applied as mentioned earlier. Further, the described embodiment is arranged in such manner that the amplification process and cubic expression process are performed in an alternating fashion, but, even in the case where these processes is performed in a non-alternating (biased) fashion, it is possible to obtain a more or less effective distortion sound. Furthermore, more than three expressions may be connected in series. Compressor, equalizer etc. may also be used for other effects. Most effectively, the equalizer may be provided between the A/D converter 3 and the distortion effect imparting section 4.

According to the present invention as described above, because tone signal is distorted by a smooth nonlinear curve based on a multi-degree expression calculation, distortion sound of mild and rich tone color can be obtained even by digital processing.

Figure 5:
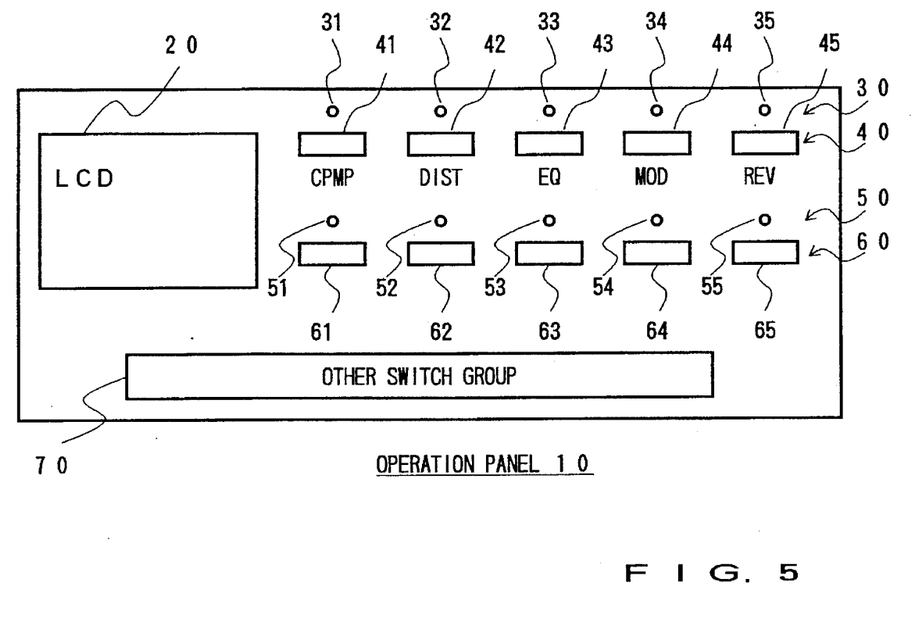
FIG. 5 diagram illustrating an example of a panel surface in the digital sound effector according to the embodiment of the present invention.

Next, description will be made on a multi-effector according to another embodiment of the invention. FIG. 5 illustrates an example of a panel surface of the multi-effector. A operation panel 10 comprises an LCD 20, a group of on/off LEDs 30, a group of on/off switches 40, a group of registration LEDs 50, a group of registration switches 60 and a group of other switches 70. The LCD 20 is provided for displaying various necessary information in response to operation of the respective switches as will be later described.

The on/off LED group 30 comprises an LED 31 for indicating the on/off state of a compressor function, an LED 32 for indicating the on/off state of a distortion function, an LED 33 for indicating the on/off state of an equalizer function, an LED 34 for indicating the on/off state of a modulation-related effect function and an LED 35 for indicating the on/off state of a reverberation function. Further, the on/off switch group 40 comprises a switch 41 for switching the on/off state of the compressor function, a switch 42 for switching the on/off state of the distortion function, a switch 43 for switching the on/off state of the equalizer function, a switch 44 for switching the on/off state of the modulation-related effect function such as chorus and a switch 45 for switching the on/off state of the reverberation function. Each LED of the on/off LED group 30 inverts its on/off state in response to operation of the corresponding switch in the on/off switch group 40.

The registration switch group 50 comprises an LED 51 for indicating the presence or absence of a registration as to whether the compressor function is reactive to a bypass command by a foot switch 82 which will be later described, an LED 52 for indicating the presence or absence of a similar registration for the distortion function, an LED 53 for indicating the presence or absence of a similar registration for the equalizer function, an LED 54 for indicating the presence or absence of a similar registration for the modulation-related effect function such as chorus. and an LED 55 for indicating the presence or absence of a similar registration for the reverberation function.

Furthermore, the registration switch group 60 comprises a switch 61 for switching the registration/nonregistration state of the compressor function, a switch 62 for switching the registration/nonregistration state of the distortion function, a switch 63 for switching the registration/nonregistration state of the equalizer function, a switch 64 for switching the registration/nonregistration state of the modulation-related effect function and a switch 65 for switching the registration/nonregistration state of the reverberation function. Each LED of the registration LED group 50 inverts its on/off state in response to operation of the corresponding switch of the registration switch group 60.

The other switch group 70 comprises switches for changing parameters for the above-mentioned various effect functions and for storing the parameters as program data. In the multi-effector according to this embodiment, the on/off states of and registration states concerning reactivity to the bypass command of the above-mentioned various functions are also stored as a part of the program, so that each of the states may be reproduced with a touch of a predetermined switch in the other switch group 70.

Figure 6:
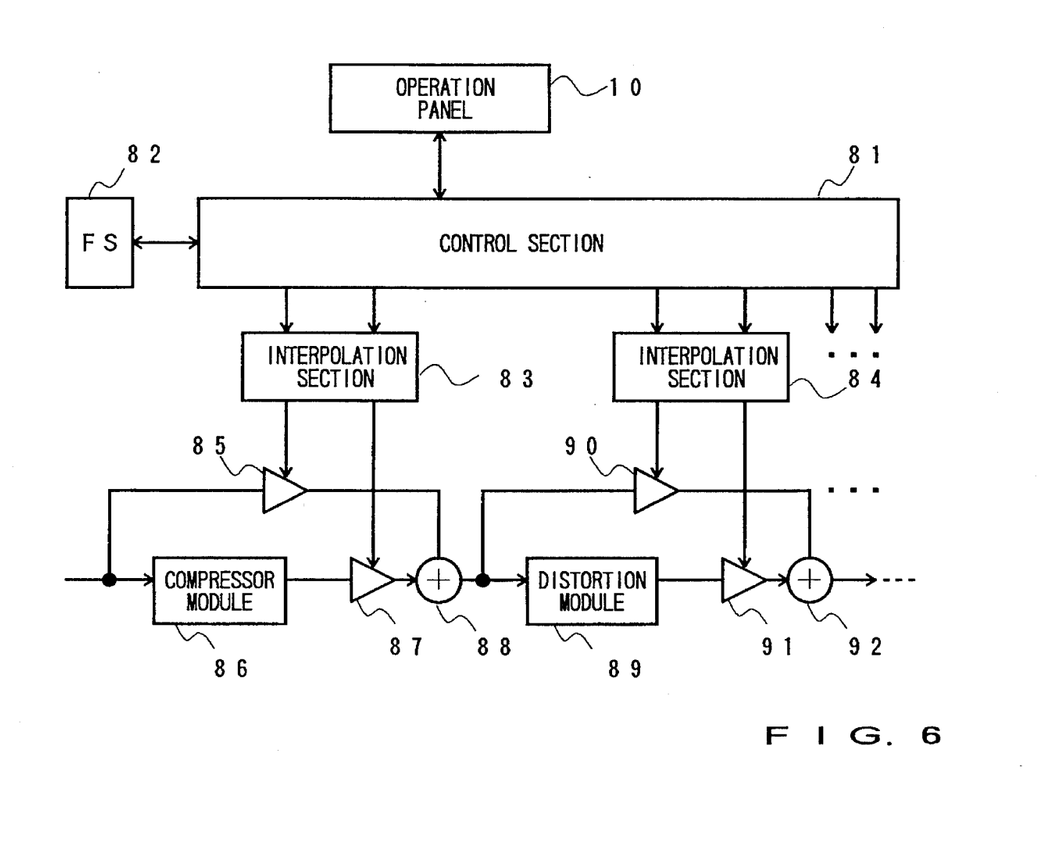
FIG. 6 is a block diagram illustrating a specific structure of the digital sound effect or according to the embodiment.

FIG. 6 is a block diagram illustrating an example of the interior structure of the multi-effector shown in FIG. 5. To a control section 81 are connected the above-mentioned panel 10, foot switch 82 for instructing the bypass function, and interpolation sections 83 and 84. In practice, other interpolation sections than the interpolation sections 83, 84 are provided, but for the convenience' sake, there are illustrated only these interpolation sections 83, 84 which are related to the compressor and distortion functions, and illustration of the other interpolation sections and circuitry corresponding thereto is omitted.

A compressor module 86 performs a compressor function. The incoming tone signal is divided into two signals, one of which is input to the compressor module 86 and the other of which is bypassed to a multiplier 85. The tone signal having been imparted a compressor effect by the compressor module 86 is given to a multiplier 87. Then, the signals processed by the multipliers 85 and 87 are added together by an adder 88.

Coefficients are provided from the control section 81 to the multipliers 85, 87 via the interpolation section 83 in such a manner that one multiplier 85 or 87 receives a coefficient "1" while the other multiplier 87 or 85 receives a coefficient "0". Namely, in cooperation with the adder 88, the multipliers 85 and 87 perform a switching function. Since the control section 81 outputs the coefficients in such a manner that "0" and "1" are instantaneously switched from one to the other, appreciable noises could occur during the coefficient switching. So, the interpolation section 83 performs an interpolation such that each coefficient value gradually changes (cross-fades) from "0" to "1" or from "1" to "0" over a time period of about few milliseconds.

A distortion module 89 performs a distortion function. The tone signal output from the adder 88 is also divided into two signals, one of which is input to the distortion module 89 and the other of which is bypassed to an adder 90. The tone signal processed by the distortion module 89 is given to a multiplier 91, and then the output signals from the multipliers 90, 91 are added together by an adder 92. Thus, for imparting the distortion effect, the circuitry portion comprising the interpolation section 84, multipliers 90, 91 and adder 92 performs, with the bypass channel, a cross-fade switching control in a similar manner to the above-mentioned. Similarly, interpolation sections and bypass multipliers, effect imparting circuits and effect imparting multipliers, and adders are provided for each of an equalizer module which performs an equalizer function, a modulation module which performs a modulation-related effect such as chorus, a reverberation module which performs a reverberation effect etc. But illustration of these components is omitted to avoid unnecessary duplication.

In order to perform switching between the bypass channels and the effect imparting sections, the control section 81, in accordance with a program shown in a flowchart to be described below, provides the respective interpolation sections with switching coefficients "0" and "1". The control section 81 also controls the respective effect function modules in response to parameter adjusting operation for the corresponding effect functions, but such a control will not be described here.

Figure 7:
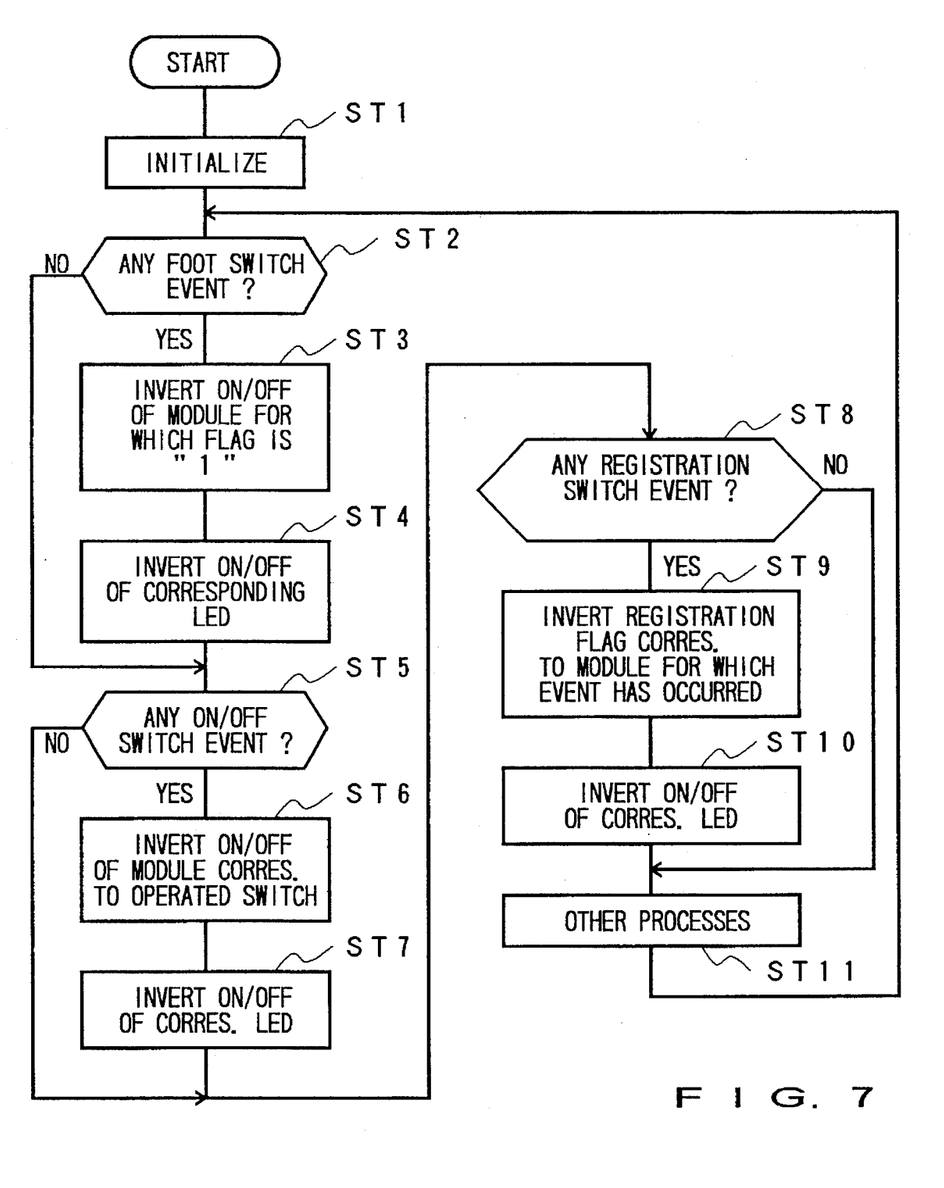
FIG. 7 is a flowchart illustrating an example of a control program carried out by a control section shown in FIG. 6.

FIG. 7 is a flowchart illustrating a control program carried out by the control section 81. The operation of the control section 81 will be described below with reference to this flowchart.

When an unillustrated power supply is switched on, various controls according to the flowchart is initiated. First, in step ST1, various parameters are initialized. In this initialization step, predetermined initial parameters may be loaded, or parameters that were available when the power supply was switched off last may be loaded. Then, the flow goes to step ST2, in which it is determined, by scanning the state of the foot switch 82, whether there is any operation event of the switch 82 for instructing the bypass function. With a determination that there is no operation event of the foot switch 82, the flow goes to step ST5, but if there is such an operation event, the flow goes to step ST3, in which registration flags corresponding to the effect modules are examined so as to invert the on/off state of any effect module for which flag is "1". The registration flags are provided within an interioriam of the control section 81 in corresponding relation to the effect modules, for registering any effect module for which inversive switching control of the bypass state should be made effective in accordance with the operation of the foot switch. Namely, as will be later described in steps ST8 and ST9, each of the flags provides the interpolation sections of the corresponding effect module with switching coefficients "0" and "1" that have been inverted from the preceding values, so as to switch the bypass state of the effect module. Next, in step ST4, the on/off state of the corresponding LED in the on/off LED group 30 is inverted in order to inform the user of whether the corresponding effect is on or off.

In step ST8, the on/off switch group 40 is scanned to determine whether any of the switches in the group has been operated. The flow goes to step ST8 if the determination result is NO, but goes to step ST6 if there is such an operation event. In step ST6, inversion is made of switching coefficients "0" and "1" of the bypass state in the effect module corresponding to the operated on/off switch. After that, the flow advances to step ST7, in which the on-off state of the corresponding LED in the on/off LED group 30 is inverted in order to inform the user of whether the corresponding effect is on or off.

Next, in step ST8, the registration switch group 60 is scanned to determine whether any of the switches in the group has been operated. The flow goes to step ST11 if the determination result is NO, but goes to step ST9 if there is such an operation event. In step ST9, inversion is made of the contents of the flag corresponding to the effect module for which the operation event has occurred. In the above-mentioned step ST3, reference is made to the flags to confirm which effect module is in the registration state that is reactive to the bypass instruction by the foot switch and which effect module is in the nonregistration state that is not reactive to the bypass state. In accordance with such a confirmation, inversive switching is made of the bypass channel only for each effect module which has been confirmed as being in the registration state. After that, the flow goes to step ST10, in which the on/off state of the LED in the on/off LED group 30 for which the operation event has occurred is inverted in order to inform the user of whether the corresponding effect is in the registration or nonregistration state.

Other processes are performed in step ST11, after which the flow goes back to step ST2 to repeat the process as mentioned earlier. The other processes of step ST11 includes a process for programming the above-mentioned parameters and a process for displaying information on the display.

Next, description will be made on the usage of the multi-effector device according to the embodiment. The user, after having turned on the power supply, set, in advance, parameters to achieve desired effects. It is assumed that, at this time, all the effect modules are in the on-state with all of the LEDs 31–35 being lit up (on), and all the effect modules are registered as being reactive to the respective bypass instructions with all of the flags being at "1" and all of the LEDs 51–55 being lit up (on). If the foot switch is stepped on in these conditions, the foot switch operation event is detected in step ST2 of FIG. 7, so that, in step ST3, the bypass state of each effect modules for which registration flag is at "1", i.e., the bypass states of all the effect modules are inverted to the off-state. Thus, in step ST4, all the LEDs in the on/off LED group 30 are lit out. Of course, a sound obtained in this manner will have no effect imparted thereto. If the foot switch 82 is then stepped on again, the bypass states of all the effect modules are again inverted so that all the effect functions are turned on and all the LEDs in the on/off LED group 30 are again lit up. If used in this way, the multi-effector according to the embodiment performs a function which is completely identical to that achieved by the conventionally-known bypass switches.

In this condition, if the user turns on the registration switch 63 and then the registration switch 65, the equalizer and reverberation effects can be made unreactive to the bypass instructions. In response to this operation, the registration flags corresponding to the equalizer and reverberation modules are inverted to "0" in steps ST8, ST9 and ST10 of FIG. 3, and then the LEDs 53 and 55 are lit out. If the foot switch 82 is operated in such conditions, this foot switch event is detected in step ST2 so that inversive switching is made of the bypass channels of the compressor and distortion modules for which registration flags are both at "1" in step ST3 and then the LEDs 31, 32 and 34 are lit out. On the other hand, since the registration flags of the equalizer and reverberation modules are still at "0" with no change made, these effects are left in the on-state and thus the LEDs 33 and 35 also remains lit-up. Then, if the foot switch 82 is operated again, all the effect functions are turned on as before and all the on/off LEDs are lit up again.

Further, if, for example, the on/off switch 41 is operated in such conditions so as to turn off the modulation effect, the corresponding LED 34 is lit out, and the modulation module is brought into the bypass state and therefore turned off or made ineffective. At this time, the compressor effect is "on" and in the registration state, the distortion effect is "on" and in the nonregistration state, the equalizer effect is "on" and in the nonregistration state, the modulation effect is "off" and in the registration state, and the reverberation effect "on" and in the nonregistration state.

Even when the foot switch 82 is operated in such conditions, the equalizer and reverberation effects are left unchanged because they are in the nonregistration state. In contrast, the compressor and distortion effects are turned off in response to this operation and the LEDs 31 and 32 are lit out. In addition, the bypass state of the modulation effect which has been in the off-state till then is inverted to the on-state, so that the LED 34 is lit up. In other words, the compressor and distortion effects and the modulation effect alternately repeats their on/off states each time the foot switch 82 operated. This embodiment permits such a particular use of the multi-effector by employing the above-mentioned inversion processing in stead of simple bypass processing.

It should be understood that each of the effect modules in the embodiment may be realized by applying predetermined microprogramming by the use of DSP, or, of course, may be realized by analog circuitry. Further, the effect modules may be controlled by the use of a control pedal etc. in stead of a foot switch.

What is claimed is:

1. A digital sound effector comprising:

analog-to-digital conversion means for converting an input analog sound signal into a digital signal:

distortion effector means for imparting a distortion effect to said digital signal from said analog-to-digital conversion means, said distortion effector means including multiplication means for multiplying said digital signal by a distortion control coefficient to provide a multiplied digital signal having a predetermined number of digital bits that is limited to a numerical value range that corresponds to the predetermined number of digital bits, and calculation means for performing a predetermined multi-degree expression calculation on said multiplied digital signal using a multi-degree expression to provide a digital output signal, wherein said calculation means comprises first multiplication means for multiplying said multiplied digital signal by a first constant to provide a first multiplication means output;

squaring means for squaring the first multiplication means output to provide a squaring means output;

addition means for adding a second constant to the squaring means output to provide an addition means output;

second multiplication means for multiplying the addition means output by the first multiplication means output; and third multiplication means for multiplying the second multiplication means output by a third constant, and wherein the numerical value range of said multiplied digital signal is limited to provide an input to the calculation means corresponding to a specific portion of said multi-degree expression that provides a smooth distortion characteristic; and digital-to-analog conversion means for converting said digital output signal from said distortion effector means into an analog signal.

2. A digital sound effector comprising:

analog-to-digital conversion means for converting an input analog sound signal into a digital signal;

distortion effector means for imparting a distortion effect to the digital signal from said analog-to-digital conversion means, said distortion effector means including:

calculation means for performing a predetermined cubic expression calculation on the digital signal, the calculation means including:

first multiplication means for multiplying said digital signal by a first constant to provide a first multiplication means output signal;

squaring means for squaring the first multiplication means output signal to provide s squaring means output signal;

addition means for adding s second constant to the squaring means output signal to provide an addition means output signal;

second multiplication means for multiplying the addition means output signal by the first multiplication means output signal; and third multiplication means for multiplying the second multiplication means output signal by a third constant; and fourth multiplication means provided in series with said calculation means for multiplying the digital signal by a coefficient that is adjusted so as to provide an input to a specific portion of the cubic expression which exhibits a smooth distortion characteristic; and digital-to-analog conversion means for converting the digital output signal from said distortion effector means into an analog signal.

3. A method of digitally processing an analog input sound signal to provide an analog output signal having a distortion effect, the method comprising:

converting the analog input sound signal into a digital sound signal;

multiplying the digital sound signal by a distortion control coefficient to provide a multiplied digital signal having a predetermined number of digital bits that is limited to a numerical value range that corresponds to the predetermined number of digital bits;

performing a predetermined multi-degree expression calculation on the multiplied digital signal to provide a digital output signal, wherein the numerical value range of said multiplied digital signal is limited to provide an input to a specific portion of the multi-degree expression that provides a smooth distortion characteristic, wherein the multi-degree expression is a cubic expression; and converting the digital output signal from into said analog signal having a distortion effect, wherein the step of performing a predetermined multi-degree expression calculation on the multiplied digital signal includes the steps of:

multiplying said multiplied digital signal by a first constant to provide a first scaled digital signal;

squaring the first scaled digital signal to provide a squared digital signal;

adding a second constant to the squared digital signal to provide a summed digital signal;

multiplying the summed digital signal by the first scaled digital signal to provide a second scaled digital signal; and multiplying said second scaled digital signal by a third constant to provide the digital output signal.

* * * * *